United States Patent
Filippi et al.

(10) Patent No.: US 6,202,191 B1
(45) Date of Patent: Mar. 13, 2001

(54) ELECTROMIGRATION RESISTANT POWER DISTRIBUTION NETWORK

(75) Inventors: Ronald G. Filippi; Phillip C. Lin, both of Wappingers Falls; Thomas M. Shaw, Peekskill; Richard A. Wachnik, Mount Kisco, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/333,604

(22) Filed: Jun. 15, 1999

(51) Int. Cl.[7] .................................................. G06F 17/50
(52) U.S. Cl. ................................................................ 716/5
(58) Field of Search ........................... 438/622; 257/522; 716/4

(56) References Cited

U.S. PATENT DOCUMENTS

| | | |
|---|---|---|
| 5,742,099 | 4/1998 | Debnath et al. . |
| 5,801,091 | * 9/1998 | Efland .................................. 438/622 |
| 6,016,000 | * 1/2000 | Moslehi ............................... 257/522 |

OTHER PUBLICATIONS

"The effect of current density and stripe length on resistance saturation during electromigration testing", by R. G. Filippi, et al., Appl. Phys. Lett. 69 (16), Oct. 14, 1996, 1996 American Institute of Physics.

* cited by examiner

Primary Examiner—Matthew Smith
Assistant Examiner—Thuan Do
(74) Attorney, Agent, or Firm—Scully, Scott, Murphy & Presser; Robert M. Trepp, Esq.

(57) ABSTRACT

Method for forming a novel power grid structure for integrated circuit semiconductor chip devices that exhibits increased electromigration resistance by including diffusion blocking interlevel contacts and employing a regular array of conducting line elements with "phase shift" between adjacent tracks of segmented power busses. The novel grid structure includes a first metal layer including a first set of conducting line segments that are substantially parallel to one another and run in a first direction; a layer of diffusion blocking dielectric insulation above the first layer; a second metal layer including a second set of conducting line segments substantially parallel to each other and running in a second direction orthogonal to the first direction; and, interlevel contact studs disposed substantially vertically through the diffusion blocking dielectric insulation layer for electrically connecting aligned line segments of the first and second sets, wherein each segment of the first and second sets of line segments is limited to a predetermined length by a diffusion blocking boundary.

46 Claims, 15 Drawing Sheets

Vss and Vdd segments on first and second metal levels. Interlevel vias connect segments from each metal level.

```
X0 = 40 'X spacing of lines
Y0 = 16 'Y spacing of lines
X1 = 8 'width of gap in lines
Y1 = 4 'width of gap in lines A = 4 'Line length in units of X0
B = 4 'Line length in units of Y0

YS = -Y0 * 1 / 2 'Shift of horizontal lines with respect to vertical lines
Xdd = X0 / 2 'X placement of Vdd network with respect to Vss
Ydd = Y0 / 2 Y placement of Vdd network with respect to Vss 'Generate Level 1 lines from Vss and Vdd
i = 0
j = -30 'Chosen to span entire area of screen
DO WHILE j < 30
DO WHILE XB < 640
'Calculate beginning and end coordinates
XB = (i * X0)
XE = (i * X0)
YB = ((A * j + i) * Y0) + Y1
YE = ((A * j + i + A) * Y0) - Y1
LINE (XB, YB)-(XE, YE), 16              'Draw Vss lines
LINE (XB + Xdd, YB + Ydd)- (XE+ Xdd, YE + Ydd), 4 'Draw Vdd lines
i = i +1
LOOP
i = 0
j = j + 1
YB = 0
XB = 0
LOOP
```

FIG. 9(a)

```
'Generate Level 2 lines for Vss and Vdd
i = -40
j = 0
DO WHILE i < 40
DO WHILE XB < 600 OR YB < 200
'Calculate beginning and end coordinates
XB = (-3 / 2) * X0 + (B* i + j) * X0 + X1
XE = (-3 / 2) * X0 + (B * i + j + B) * X0 - X1
YB = (j + 1) * Y0 +YS
YE = (j + 1) * Y0 + YS
LINE (XB, YB)-(XE, YE)                    'Draw Vss Lines
LINE (XB + Xdd, YB + Ydd)-(XE + Xdd, YE + Ydd), 4 'Draw Vdd Lines
j = j + 1
LOOP
j = 0
i = i + 1
YB = 0
XB = 0
LOOP
```

FIG. 9(b)

```
'Generate Interlevel Contacts for Vss and Vdd networks
i = 0
j = -40
DO WHILE j < 40
DO WHILE XSt < 640
'Calculate stud positions
XSt = i * X0
YSt = (j + 1 / 2) * Y0
CIRCLE (XSt, YSt), 3            'Draw Vss Studs
CIRCLE (XSt + Xdd, YSt + Ydd), 3, 4 'Draw Vdd Studs
i = i + 1
LOOP
i = 0
j = j + 1
YSt = 0
XSt= 0
LOOP
```

FIG. 9(c)

ELECTROMIGRATION RESISTANT POWER DISTRIBUTION NETWORK

BACKGROUND OF THE INVENTION

1. Field of the Invention

The present invention relates to power distribution schemes in integrated circuit chips (ICs), and specifically, to a novel power distribution network for ICs that exhibits increased electromigration resistance while maintaining redundancy and lower resistance.

2. Discussion of the Prior Art

Power for integrated circuits is usually distributed on a chip by a grid of continuous metal lines. Typically, there are two separate grids; one at ground potential and one at Vdd.

As illustrated in FIG. 1(a), a "continuous" grid 12 may be formed from orthogonal sets of lines on respective two different wiring levels in the chip. Specifically, a set of parallel lines 8a, 8b for example, is patterned at one chip wiring level and are connected to a second orthogonal set of lines 10a, 10b on the second wiring level via studs so as to form the continuous grid. In present chip designs, the length of the lines is determined by the size of the area over which power must be distributed which may be many hundreds of microns. The power grids must satisfy several different requirements: First, the resistance of the grid must be kept low to avoid unwanted voltage drops during chip operation. The grid must also have sufficient redundancy to permit easy connection of devices in regions of the chip where the inclusion of additional components disrupts the continuous grid. Finally, the electromigration resistance of the lines in the grid must be sufficient to ensure the reliability of the interconnects at intended current densities. In some instance, the electromigration resistance of the lines becomes the limiting factor and determines the dimensions of the lines that must be used for the grid.

Other prior art power distribution schemes, such as shown in FIG. 1(b) and described in detail in U.S. Pat. No. 5,742,099 to Debnath et al., comprise short length lines 11a, 11b interconnected via studs to other layers. However, the shorter line segments are employed and implemented for the purpose of enhancing wireability of an integrated circuit, i.e., decreasing area of the integrated circuit. Particularly, maximizing wireability requires the introduction of gaps in the normally continuous conductors that lie upon a line perpendicular to the short segments. U.S. Pat. No. 5,742,099 thus teaches the segmentation of the power and ground busses to improve wireability of control logic using automatic routing tools, however does not recognize, teach or suggest the benefits of increased electromigration resistance and greater grid redundancy.

It has been observed by Filippi et al. in "The Effect of Current Density and Stripe Length on Resistance Saturation during Electromigration Testing", Applied Physics Letters Vol. 69 (16), p. 2350, Oct. 14, 1996, that short segments may limit the amount of electromigration damage that may occur in a conducting line at a given current density, thus, permitting larger currents to be used in designs using only short line segments.

It would be highly desirable to provide a power grid and distribution network structure for integrated circuit (IC) devices that exhibits increased electromigration resistance while still maintaining the redundancy and low resistance of the grid.

Moreover, it would be highly desirable to provide a grid structure that exhibits increased electromigration resistance by including diffusion blocking interlevel contacts and employing a regular array with "phase shift" between adjacent tracks of segmented power busses.

SUMMARY OF THE INVENTION

It is an object of the present invention to provide a power distribution network for an IC device that exhibits increased electromigration resistance while still maintaining the redundancy and low resistance of the grid.

According to the principle of the invention, there is provided a conductive grid structure and method for manufacturing a conductive grid structure for distributing electrical power with reduced electromigration in an integrated circuit device. The structure comprises a first layer including a first set of conducting line segments that are substantially parallel to one another and run in a first direction; a layer of insulation above the first layer; a second layer including a second set of conducting line segments substantially parallel to each other and running in a second direction orthogonal to the first direction; and, interlevel contact studs disposed substantially vertically through said insulation layer for electrically connecting aligned line segments of the first and second sets, wherein each segment of the first and second sets of line segments is limited to a predetermined length by a diffusion blocking boundary.

In the invention, continuous lines in a power distribution grid are replaced with a grid made up entirely of short line segments, thus permitting higher current densities by decreasing electromigration phenomena, while additionally maintaining redundancy and low grid resistance.

BRIEF DESCRIPTION OF THE DRAWINGS

Further features, aspects and advantages of the apparatus and methods of the present invention will become better understood with regard to the following description, appended claims, and accompanying drawings where:

FIGS. 9(a)–9(c) illustrate a sequence of instructions for generating a power distribution grid according to the methodology of the invention.

DETAILED DESCRIPTION OF THE PREFERRED EMBODIMENTS OF THE INVENTION

The present invention is a method and apparatus for increasing the electromigration resistance of an IC power distribution grid while still maintaining the redundancy and low resistance of the power grid.

Figure 1A:
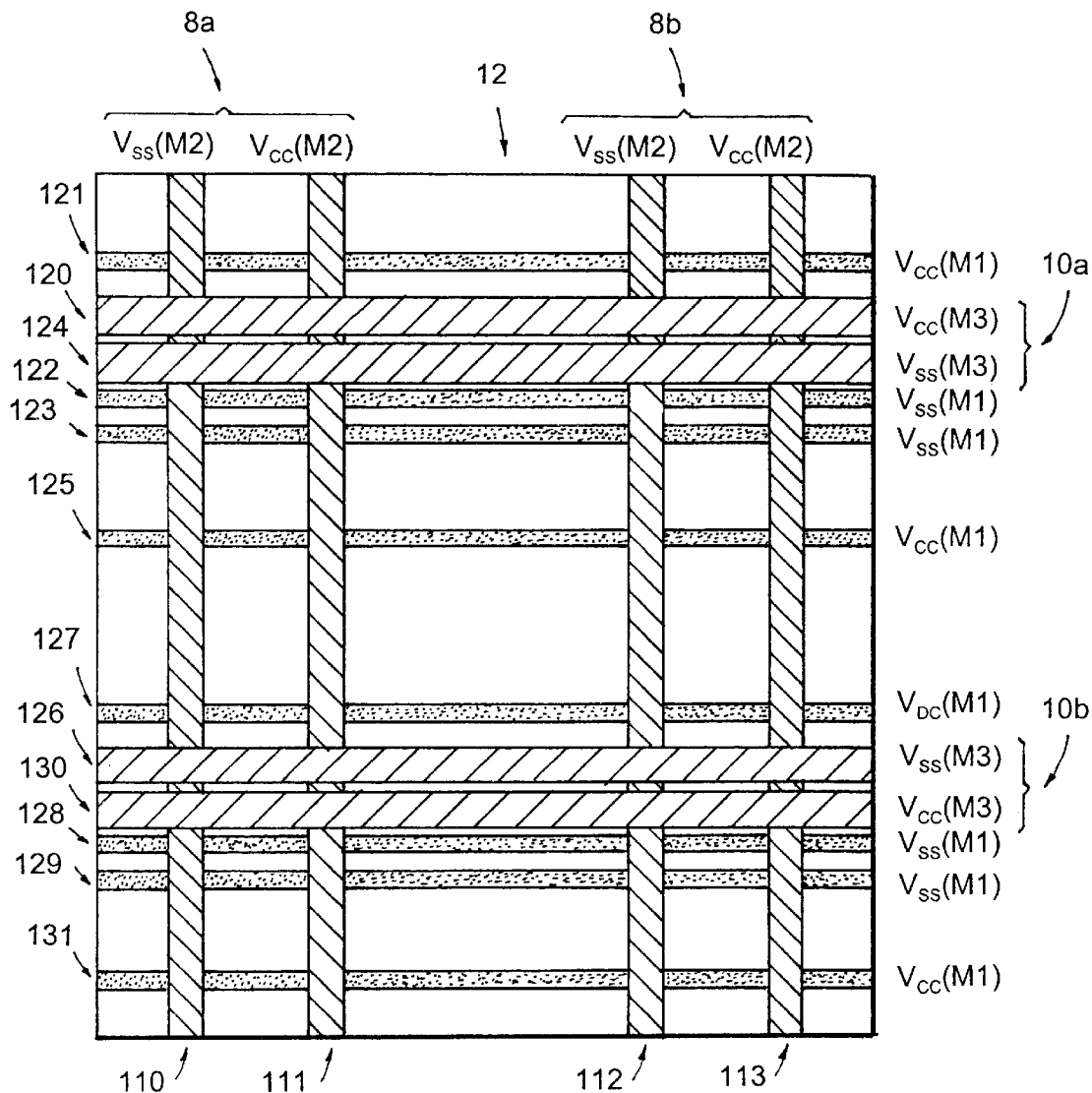
FIG. 1(a) illustrates a continuous power grid structure according to the prior art.
Figure 1B:
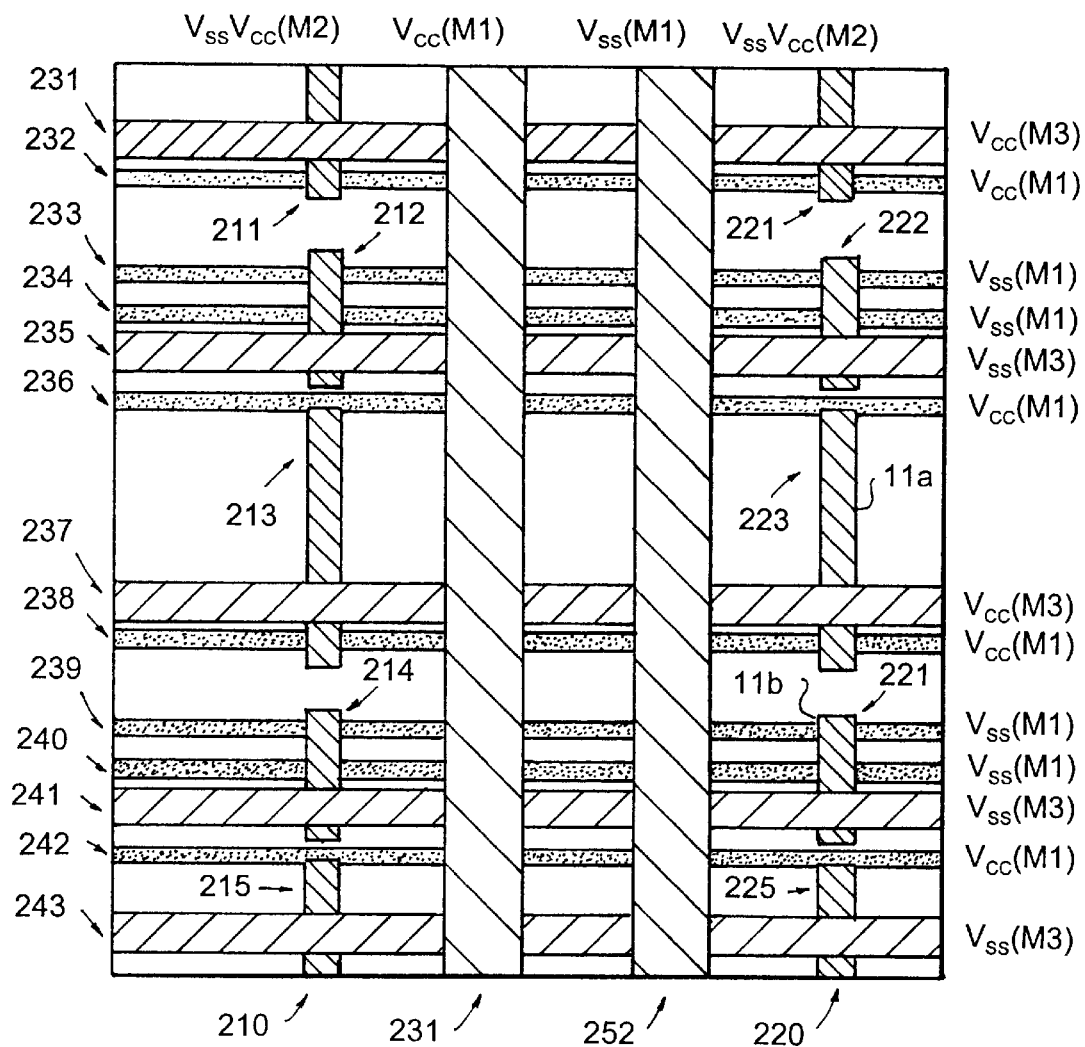
FIG. 1(b) illustrates a power grid segmented on one metal level to improve wireability according to the prior art.
Figure 2A:
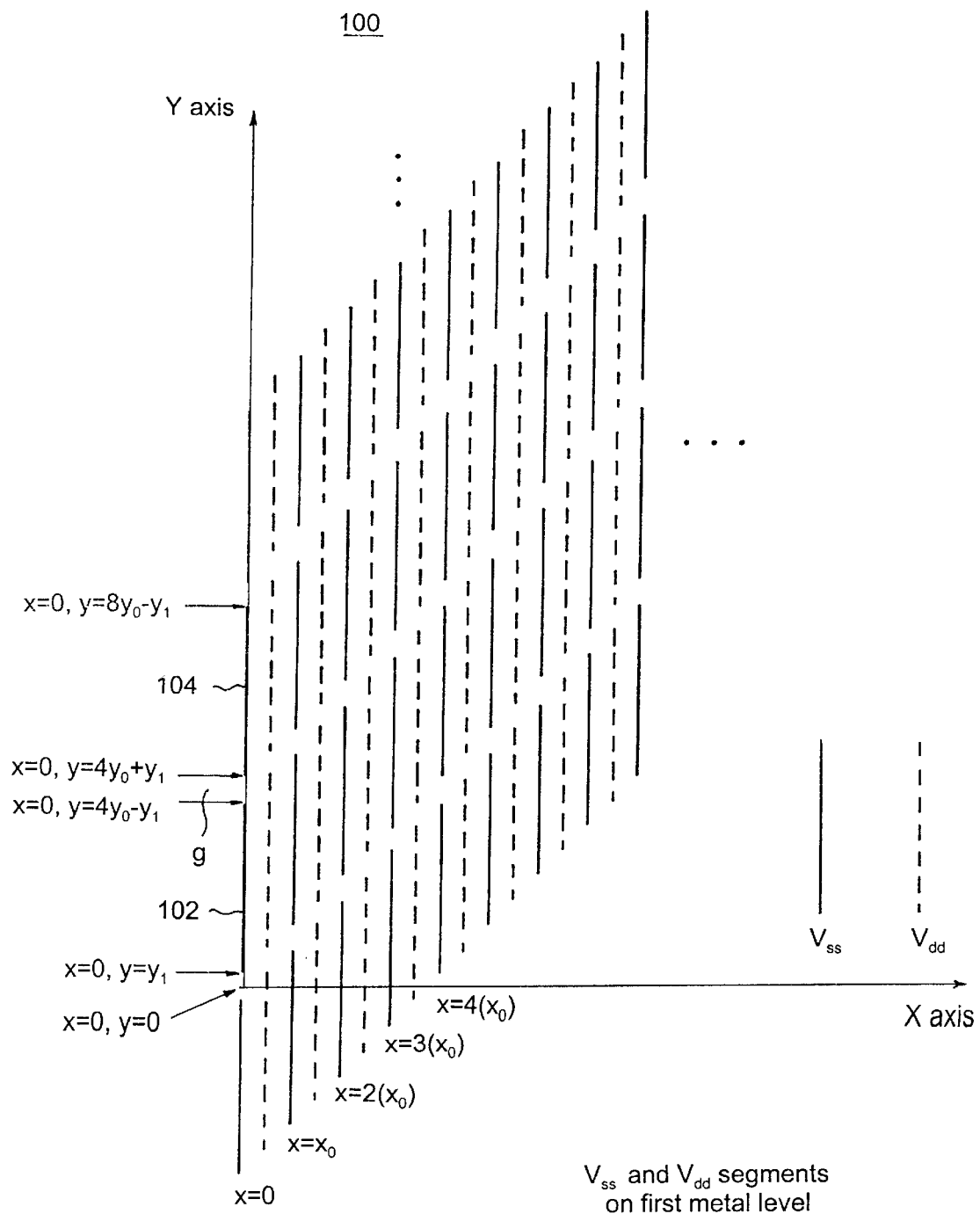
FIGS. 2(a)–2(c) illustrates a procedure for creating a class of power distribution networks according to the invention.
Figure 2B:
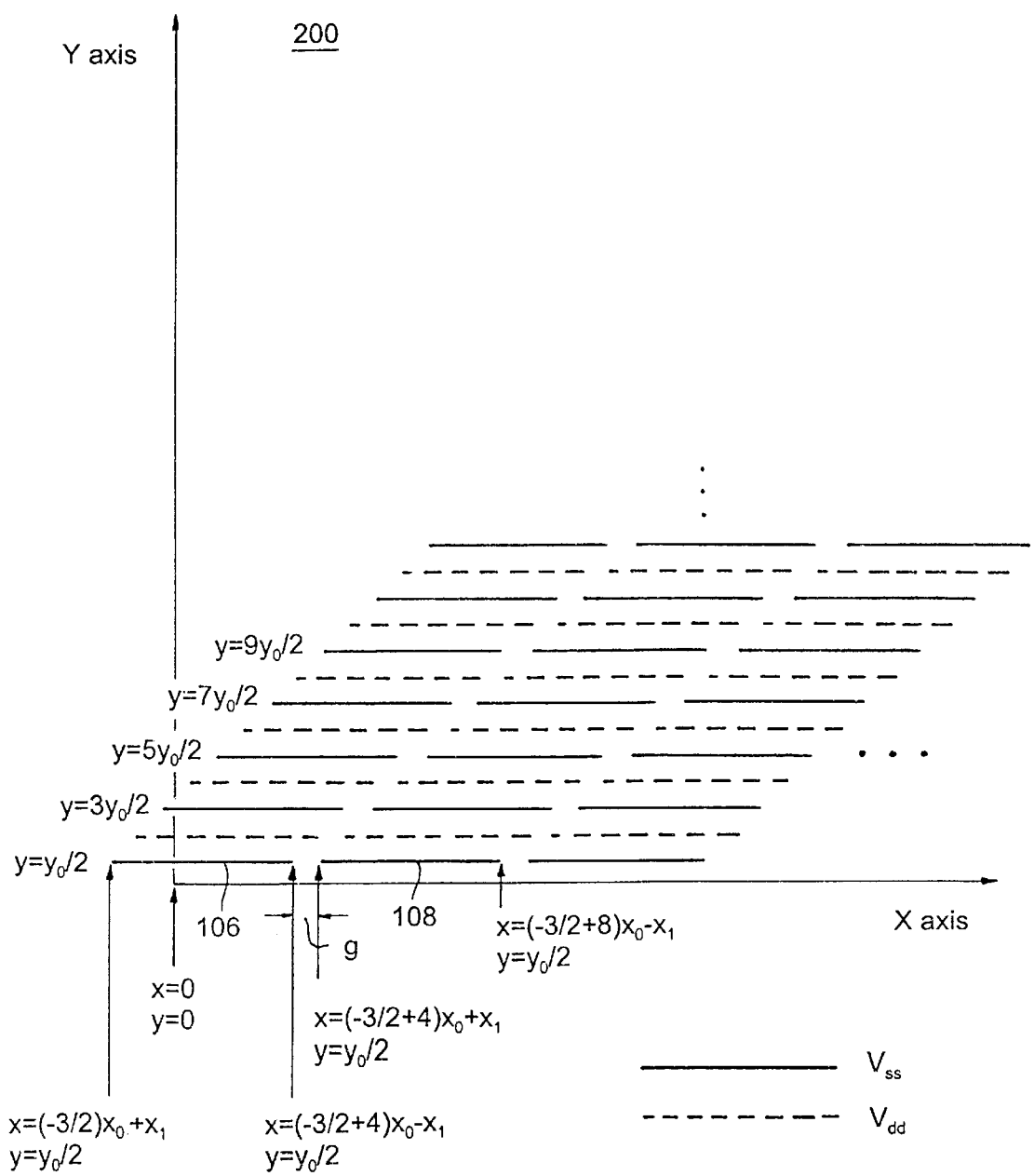
Figure 2C:
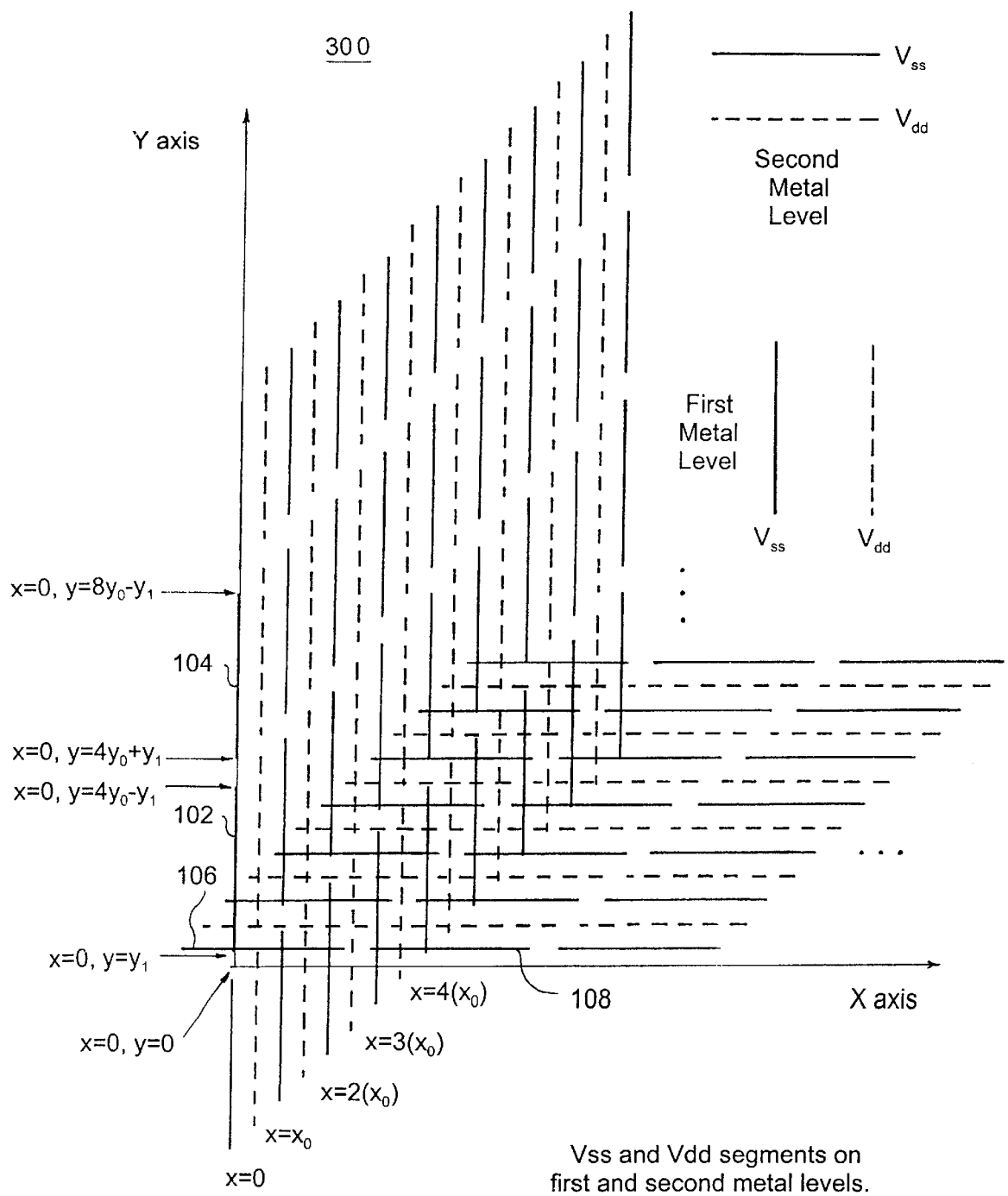
Figure 2D:
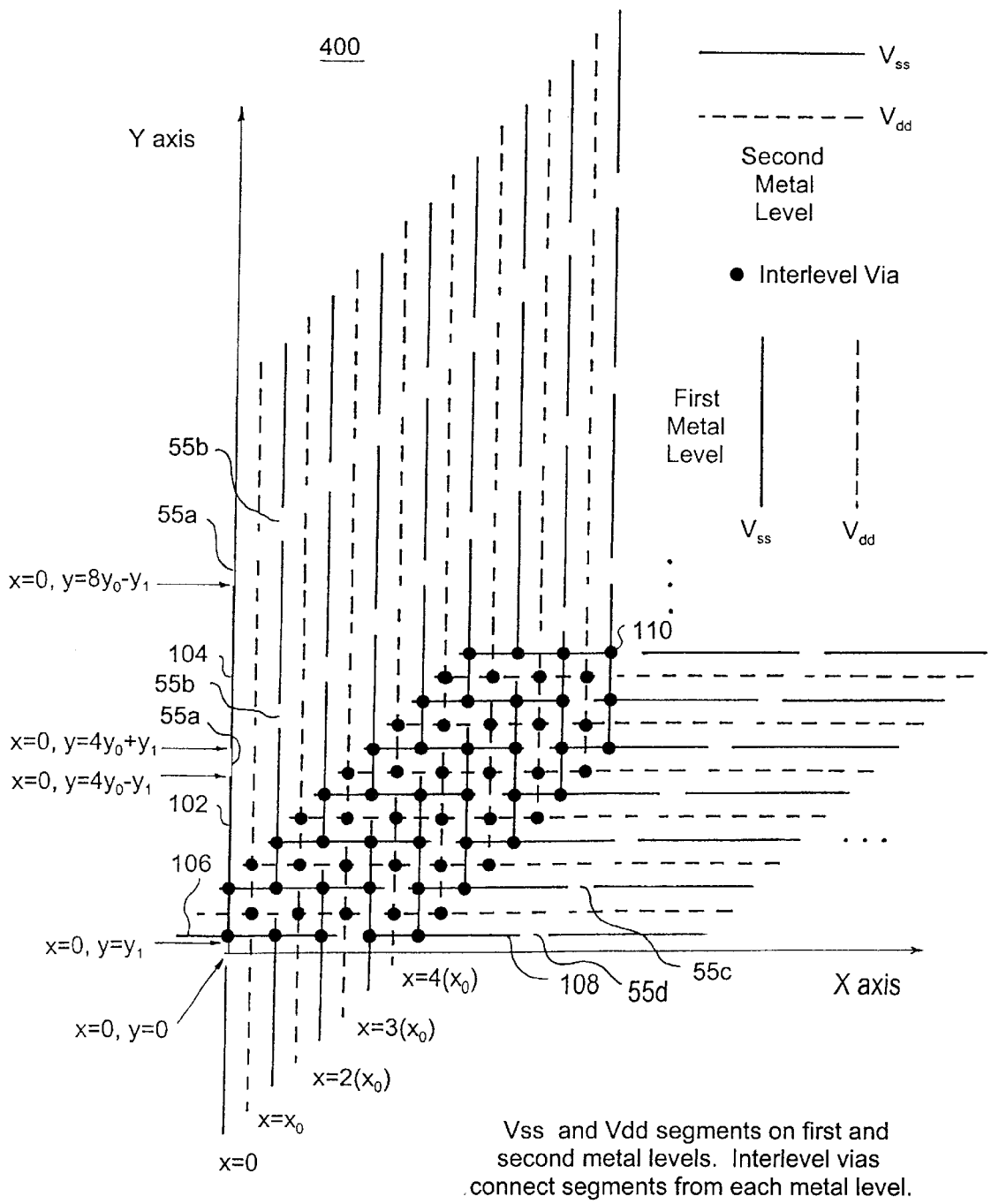
FIG. 2(d) illustrates conceptually a continuous power grid structure having shortened dead end segments according to the invention.

FIG. 2(d) illustrates the power distribution grid pattern 400 according to the invention. As shown in FIG. 2(d), the grid pattern 400 has a similar geometry as orthogonal grid of lines according to the prior art, however, is made up entirely of line segments that are only about four times larger than the dimension of the cell size of the grid and further includes gaps, e.g., gaps 55a in a vertical dimension and gaps 55c in a horizontal dimension that are "phase shifted" with respect to gaps, e.g., gaps 55b, 55d, respectively, of adjacent tracks (in the same dimension) of the segmented power line. In current designs, the cell size is about 25 microns. Thus, line segments of 100 micro meters may be used to layout the grid which length has been determined to exhibit significantly better electromigration resistance. Furthermore, lines segments of this length have a minimum impact on the resistance and redundancy of the grid than one comprising long lines, i.e., greater than 100 $\mu$m. It should be understood that many similar implementations of the concept shown in FIG. 2(d) are conceivable. While it is possible to further reduce the resistance of the grid 400 by reconnecting the gaps 55 in the grid using studs and a short line segment on the second wiring level or by including a segment of line that acts to block the migration of conductor in the line segments, this must be done in such a way as to avoid intersection of lines in the second grid.

The power distribution scheme may be implemented by several manufacturing processes. One specific embodiment uses a subtractive etch to pattern the metal layer as described in this invention. Preferably, line segments comprise a metallic element such as gold, copper, aluminum, silver or, alloys thereof. The interlevel contacts (studs) which connect the metal layers are fabricated out of a material which diffuses very slowly such as tungsten. However, it should be understood that the stud may comprise an element such as W, Ta, Re, Hf, TiN, Pt, Ir, Zr, Ti or, alloys thereof. The diffusion of the patterned metal layer by electromigration may be controlled by depositing a high modulus dielectric over the pattern and disposing the second patterned metal layer on top of the dielectric layer. Preferred insulating dielectric material may include silicon oxide, silicon nitride, polyimide, Dow SiLK™, Dow Cyclotene™ (trademarks of Dow Inc.), SiCOH or diamond-like films. A second process may utilize single or dual damascene patterning of the metal lines and fabricating vias by depositing a blocking layer in the via, as will be hereinafter described in greater detail.

Figure 6:
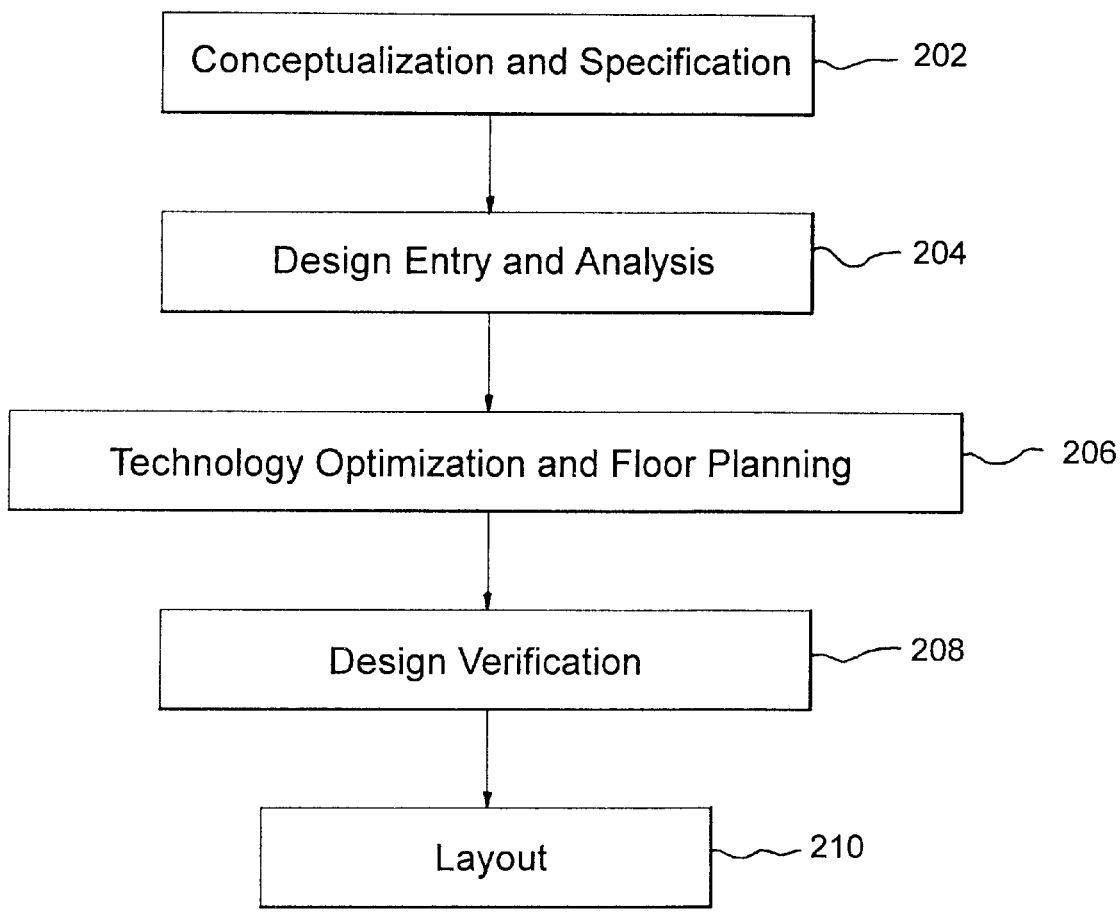
FIG. 6 is a flow diagram depicting the process for integrated circuit design.

FIG. 6 is a flow diagram 200 depicting the process for integrated circuit design. As shown in FIG. 6, a first step 202 begins with conceptualization and specification, followed by design entry and analysis at step 204, technology optimization and floor planning at step 206, design verification at step 208, and layout at step 210. The specific implementation of an optimized design for a given integrated circuit is accomplished by Electronic Design Automation (EDA) tools implemented on a computer or any other program storage device readable by a machine.

Figure 7:
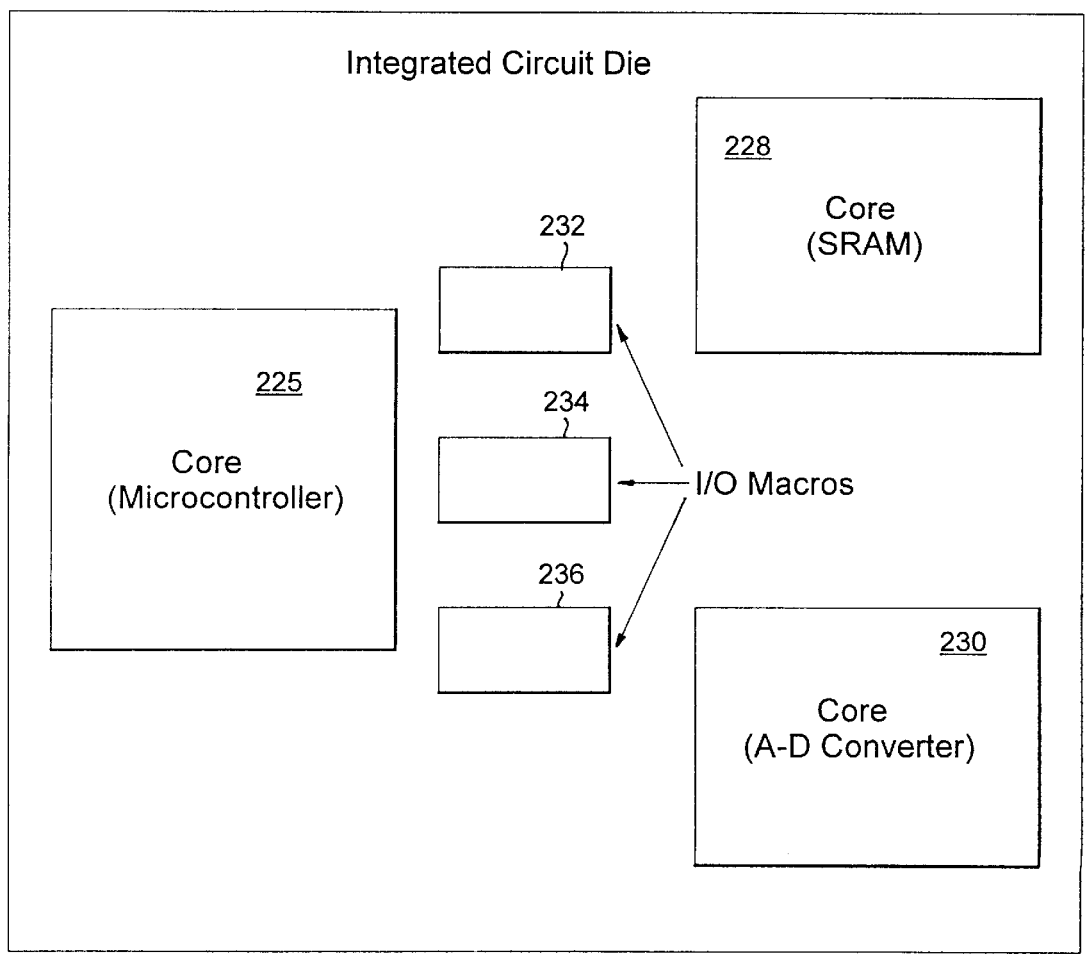
FIG. 7 illustrates the location of the individual logic gates, macros, and cores placed on an IC die during the layout phase of the integrated circuit design process.

These EDA tools may be part of a fully integrated suite, or point tools used as part of a design flow. Inputs may be generated by and received from tools in a prior step of the design flow in the form of computer data files, for example, with either a standard or unique format, and used in a subsequent step. During layout (step 210) and to some extent during technology optimization and floor planning (step 206), the capability of a power distribution grid to deliver the required voltages and current to the individual gates, macros and cores may constrain the design of an integrated circuit. These constraints may be due to resistance, noise, or electromigration. It is possible to improve the electromigration resistance of the conducting grid used to deliver power to an integrated circuit by implementing the structure as described herein. During the layout phase of the integrated circuit design process the individual logic gates, macros, and cores which contain very complex designs are placed on the die as illustrated in FIG. 7. As an example, the floor plan for the integrated circuit die 220 of FIG. 7 may comprise components such as a microcontroller core 225, a memory (SRAM) core 228, an A/D converter core 230, and several I/O macros 232, 234, 236, etc. The placement of these components is governed in part by timing, yield and ability to deliver power. The size and layout of individual gates is chosen based on transistor size constraints, wireability of the gates on an actual die and compatibility with the power distribution grid. The susceptibility of the power distribution grid to electromigration may constrain the number of high power circuits which may be placed in a given area of the die. The need to provide a low resistance path between the integrated circuit power contacts or pads and the need to make the manufactured integrated circuit die resistant to defects dictates that the power distribution grid be as redundant as possible. That is, there should be as many parallel electrical paths joining any two points in the grid as possible. Complex designs may require the implementation of additional power grids to distribute different voltage levels for biasing input/output circuits, analog circuits, or other circuits. While different parts of an integrated circuit may require different layouts, widths, or pitches from another circuit, there is a significant benefit in ease of design if the power distribution grid is regular over large areas of the chip. The complex yet highly repetitive nature of the design of integrated circuits requires that algorithms be developed to optimize and implement each step of the design flow using machine readable program storage devices. An example of such an algorithm for generating a conductive grid suitable for distributing power to an integrated circuit is specified below.

Figure 8:
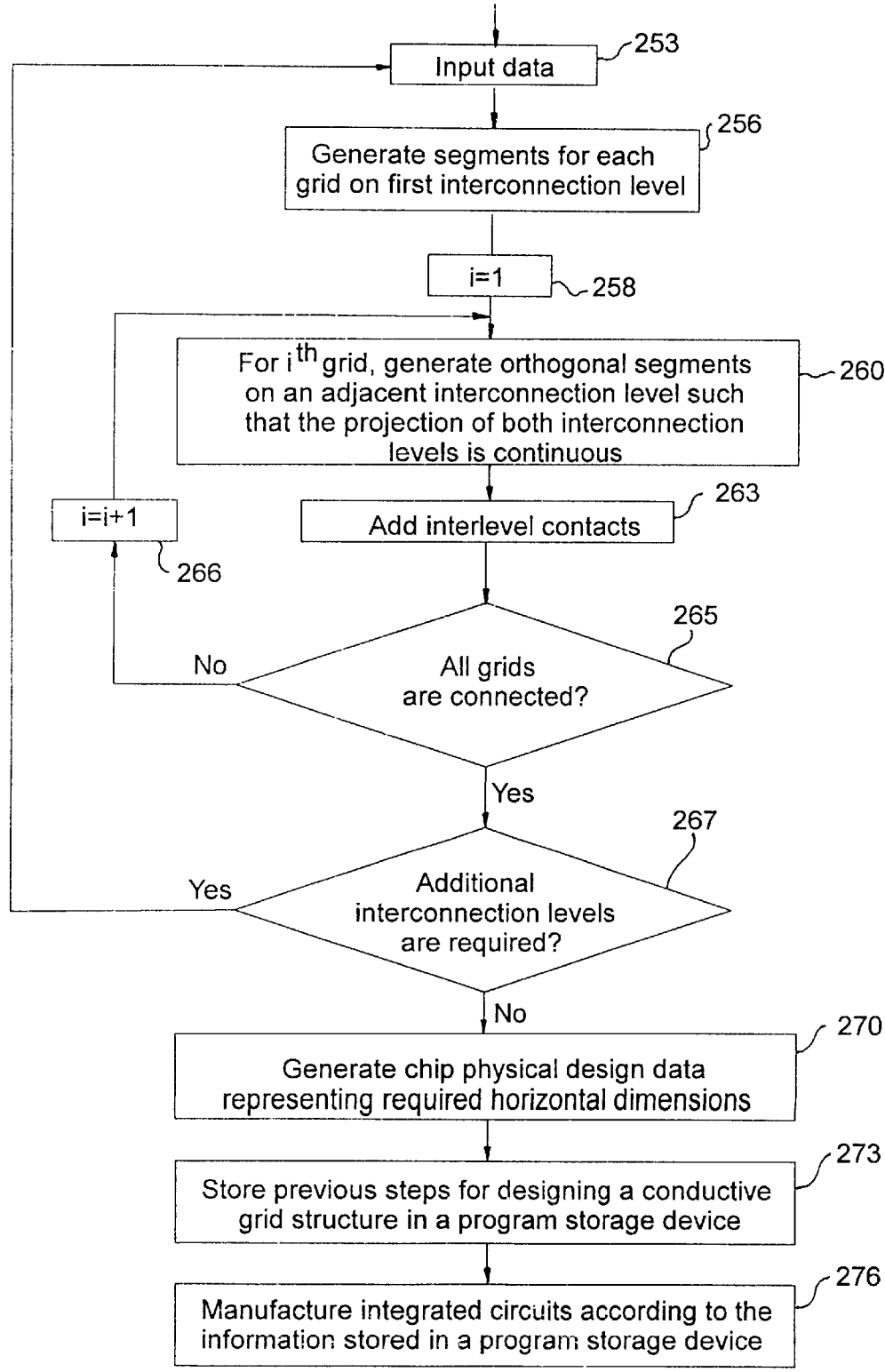
FIG. 8 is a flow chart depicting the method for generating the conductive grid structure according to the principles of the invention.

FIG. 8 illustrates a flow chart 250 for generating the conductive grid structure according to the principles of the invention. As indicated at step 253, input data generated in the technology, and the optimization and floor planning part of the design flow is used to begin the process of layout on the integrated circuit die. Such input data may comprise one or more circuit design parameters including, but not limited to: cell pitch and size, chip size, core and chip boundaries, minimum and maximum physical dimension of a gap determining periodicity, a number of power supplies, a number of wiring levels, a Vdd level, a wire width, core or macro locations, and I/O placements, etc. Additional input data may include parameters for redundancy requirements such as, for example, electromigration design rules, IR drop limit, and, power consumption of the chip. Particularly, based on these input parameters, the process begins by generating segments for each grid on a first interconnection level, as indicated at step 256. As there may be one or more grid structures generated per chip design, then, at step 258, an index "i" representing the grid is set to 1 indicating the generation of the first grid. Then, at step 260, for the $i^{th}$ grid on the first level, there is generated an orthogonal grid on a second level such that the projection of the overlaying grids is continuously connected throughout the desired die area. Furthermore, at the points where the grids overlay each other, interlevel contacts are added, as indicated at step 263. As indicated at steps 265 and 266, the index "i" is incremented, and process steps 260 and 263 are repeated until all grids of the design are connected. Once these steps are performed for each conductive grid on the first two interconnection levels, then additional interconnection levels may be added based on additional input data from the technology optimization and floor planning step of the design flow. Thus, as indicated at step 267, a determination is made as to whether additional interconnection levels are required. If additional interconnection levels are required, then the process proceeds to step 253 and the process continues. If not, then the process proceeds to step 270, where the tangible representation of the horizontal dimensions on the die may be generated for each of the conductive grids. This physical representation is to be stored on a program storage device as indicated at step 273, and read to determine the required patterns on a photolithography mask or direct write exposure tool during manufacture of an integrated circuit, as indicated at step 276.

An example procedure for creating a very useful subset of class of power distribution networks is now described in view of FIGS. 2(a)–2(d). Such a procedure may be implemented in software used in the physical and electrical design of integrated circuits. The power distribution network allows for a source of current and a sink for current to be distributed in space over an integrated circuit by short conducting segments resistant to electromigration.

Thus, a power grid may be created by placing short segments as now described with respect to FIGS. 2(a)–2(d). It is required that the interlevel contacts provide a diffusion blocking boundary between the levels and that the passivation used blocks electromigration of metal out of the designed wiring track.

As shown in FIG. 2(a), the first step involves choosing an origin at the lower left corner of the chip or area to receive the grid. Assuming a Cartesian Coordinate system having X,Y axes, points in the grid are (x,y) where x is the horizontal coordinate and y is the vertical coordinate. As shown in FIGS. 2(a)–2(d), the coordinate system is arbitrarily defined with respect to the corner of the integrated circuit chip. Next, dimensions $x_0, y_0$ are chosen to define the periodicity of the Vss (ground) and Vdd power supplies. FIG. 2(a) illustrates the grid defining the Vss and Vdd for a first metal level with $x_0/2$ and $y_0/2$ governing the space between the Vdd and ground power busses and between which books/gates will be placed. The dimensions $x_1, y_1$ are chosen to determine the gap between line segments along a dimension. For instance, as shown in the first metallization level 100 of FIG. 2(a), a gap "g" along a vertical dimension is defined as a distance $2y_1$ between segments 102 and 104. As shown in FIG. 2(a), the length of each (Vdd and Vss) segment in the first metal level 100 (vertical dimension) is $4y_0-2y_1$. It should be understood that, in the preferred embodiment, the length of a line segment is less than 300 μm (microns) which determines the electromigration resistance of the segment, however, the length may range between about 100 μm to 300 μm, and, could scale with future technology minimum feature sizes to well below 100 microns.

As further shown in FIG. 2(a), on the first metal level, the first segment, e.g., Vss segment 102, is placed from $(0,0+y_1)$ to $(0,4y_0-y_1)$. Each Vss segment in the example first metal level grid 100 of FIG. 2(a) is placed by connecting the points:

$$\{ix_0, (4j+i)y_0+y_1\} \text{ to } \{ix_0, (4j+i+4)y_0-y_1\},$$

where i and j both indicate a degree of phase shift or offset between adjacent Vss segments, with $i=0,1,2,3, \ldots, ns_{1i}$; $j=-i-1, -i, -i+1, -i+2, \ldots 0,1,2,3, \ldots, ns_{1j}$ where $ns_{1i}$ and $ns_{1j}$ are limits of the indices for positioning Vss segments on the first metal level. Each Vdd segment on the first metal level grid 100 is placed by connecting the points:

$$\{(i+\frac{1}{2})x_0, (4j+i+\frac{1}{2})y_0+y_1\} \text{ to } \{i+\frac{1}{2})x_0, (4j+i+4+\frac{1}{2})y_0-y_1\}$$

where i and j both indicate a degree of phase shift or offset between adjacent Vdd segments with $i=0,1,2,3,4 \ldots, nd_{1i}$; $j=-i-i, -i, -i+1, -i+2, \ldots 0,1,2,3,4, \ldots, nd_{1j}$ where $nd_{1i}$ and $nd_{1j}$ are limits of the indices for positioning Vdd segments on the first metal level. It is understood that the indices in the formulas described herein depend on the choice of origin and are chosen to range over the entire chip.

Next, in the manner as described in greater detail hereinbelow, interlevel vias are manufactured at locations where the conducting line segments, e.g., Vdd, to be placed on the second metal level 200 (FIG. 2(b)) pass over like segments, e.g., Vdd, on first metal level 100. For purposes of description, however, reference is now made to FIG. 2(b) which illustrates the second metallization level 200 layout.

As shown in FIG. 2(b), a gap "g" between two like power supply segments 106, 108 along a horizontal dimension is defined as a distance $2x_1$. As shown in FIG. 2(b), the length of each (Vdd and Vss) segment in the second metal level 200 (horizontal dimension) is $4x_0-2x_1$. Thus, according to the method, on the second metal level the first segment, e.g., a Vss segment 106 is placed from $\{-3/2x_0+x_1, y_0/2\}$ to $\{(-3/2+4)x_0-x_1, y_0/2\}$. Subsequent Vss segments are placed by connecting the points:

$$\{(-3/2)x_0+(4i+j)x_0+x_1, (j+1)y_0-y_s\} \text{ to } \{(-3/2)x_0+(4i+j+4)x_0-x_1, (j+1)y_0-y_s\},$$

where $y_s$ is a shift constant equal to $y_0/2$ in this particular example, and where i and j both indicate a degree of phase shift or offset between adjacent Vss segments with $j=0,1,2,3 \ldots, ms_{2j}; i=-j-1, -j, -j+1, -j+2, \ldots 0,1,2,3, \ldots, ms_{2i}$ where $ms_{2i}$ and $ms_{2j}$ are limits of indices for positioning Vss segments on the second metal level. Subsequent Vdd segments are placed by connecting the points governed by the formula:

$$\{-x_0+(4i+j)x_0+x_1, (j+1)y_0-y_d+y_0/2\} \text{ to } \{-x_0+(4_i+j+4)x_0-x_1, (j+1)y_0-y_d+y_0/2\},$$

where $y_d$ is a shift constant equal to $y_0/2$ in this particular example, and where i and j both indicate a degree of phase shift or offset between adjacent Vdd segments with $j=0,1, 2,3,4, \ldots, md_{2j}; i=-j-1, -j, -j+1, -j+2, \ldots, 0,1,2, \ldots, md_{2i}$ where $md_{2j}$ and $md_{2i}$ are limits of indices for positioning Vdd segments on the second metal level. It is understood that the indices in the formulas described herein depend on the choice of origin and are chosen to range over the entire chip.

FIG. 2(c) illustrates the superposition of the first and second metallization layers of FIGS. 2(a) and 2(b) without via connections and FIG. 2(d) illustrates the resultant power distribution scheme 400 illustrating superposition of the first and second metallization layers including the via (stud) interlevel connections, indicated by large black dots 110. As shown in FIG. 2(*d*), interlevel vias connecting like Vss segments and placed at:

$$\{kx_0, (l+1/2)y_0\} \text{ where } k=0,1,2,3,4,\ldots,ns_k, \text{ and } l=0,1,2,3,4,\ldots ns_l$$

where $ns_k$ and $ns_l$ are limits of the indices for positioning interlevel vias connecting Vss segments at first and second metal levels.

Interlevel vias connecting like Vdd segments are placed at:

$$\{(k+1/2)x_0, ly_0\} \text{ where } k=0,1,2,3,4,\ldots,nd_k \text{ and } l=0,1,2,3,4,\ldots,nd_l$$

where $nd_k$ and $nd_l$ are limits of indices for positioning interlevel vias connecting Vdd segments at first and second metal levels.

As shown in the example of FIG. 2(*d*), the most a line segment may have is four (4) vias connecting a like line segments of the adjacent layer. It should be understood that, in actual production, line segment portions lying outside the chip boundary, e.g., from {0,0} to {0,L} to {W,L} to W,0}, are deleted.

The procedure described herein with respect to FIGS. 2(*a*)–2(*d*) may be generalized to other grids with similar properties. If a variable "A" is substituted for "4" in every first coordinate position for segments on the second metal level, and "B" is substituted for "4" in every second coordinate position for segments on the first metal level, the connectivity/redundancy of the grid is governed by the value of A and B. If A=B=1, there is no connection in the grid. If A=B=2, then the grid is only partly connected at the first and second metal levels. If both A>=3, B>=3, then connected grids may be found for appropriate values of $y_s$ and $y_d$. An example of a sequence of instructions in Quick Basic™ (trademark of Microsoft Inc.) which may be implemented on a program storage device is shown in FIGS. 9(*a*)–9(*c*). It should be understood that the larger A and B, the less electromigration resistance in each segment of the grid, but the greater the redundancy.

The procedure may be generalized to create a power distribution scheme with more than one source and sinks for electrons at different potentials, i.e., different power supply voltages.

Furthermore, the power distribution scheme 400 may be implemented as using any number of conducting or insulating materials and may be repeated on a third metal level and a fourth metal level with a periodicity different from or the same as that on the first metal level and second metal level. In addition, multiple embodiments may exist on the same integrated circuit substrate with the intent of supplying circuits with different voltages, for instance, voltage chosen to interface with circuits on separate integrated circuits. A similar scheme with three or more sets of conducting line segments, each electrically independent of the other, may be employed.

Figure 3A:
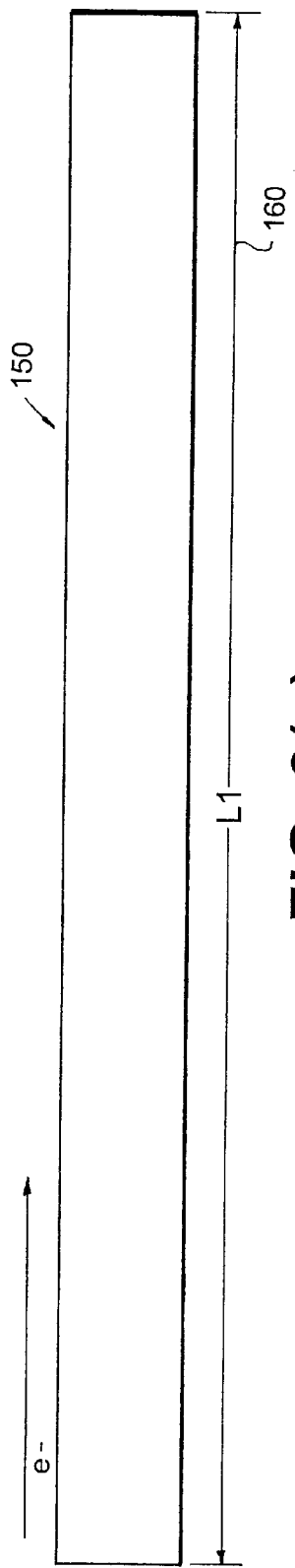
FIG. 3(a) illustrates a long line segment having a defined current flow.
Figure 3B:
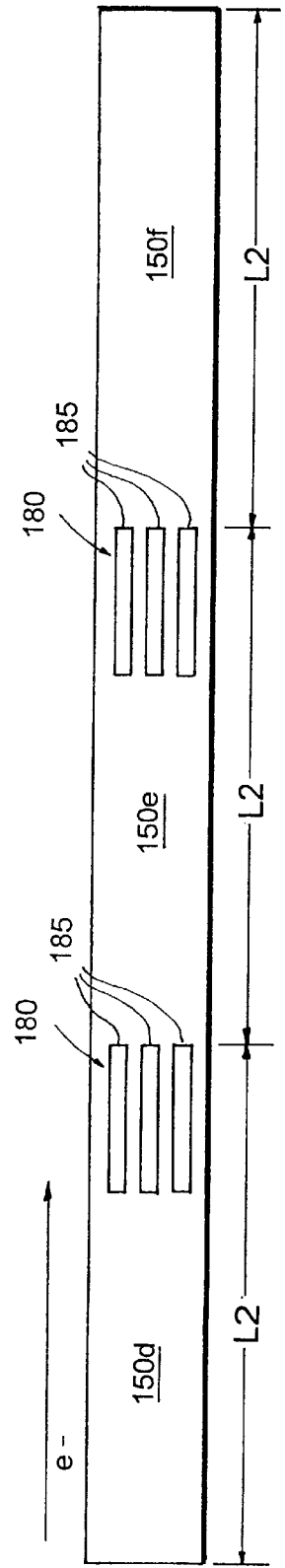
FIG. 3(b) illustrates a diffusion blocking structure for creating shorter line segments according to a first embodiment of the invention.
Figure 3C:
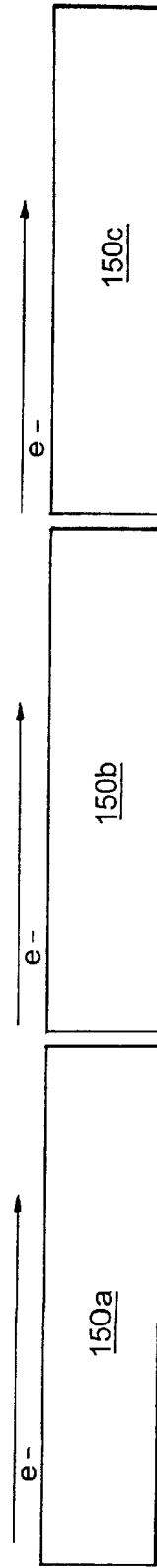
FIG. 3(c) illustrates a diffusion blocking structure for creating shorter line segments according to a second embodiment of the invention.

FIG. 3(*a*) illustrates a long line segment 150 having a defined current flow indicated by arrow 160 over a length L1. According to the principles of the invention, there is provided two methods for breaking the line up in order to create short line segments from which atoms cannot diffuse. In the example of FIG. 3(*c*), the line 150 is patterned to permit the disposition of an insulating layer 175 in a manner so as to form three adjacent linear line segments 150*a*, . . . , 150*c* with the insulating layer formed therebetween.

Preferably, the insulating dielectric employed may include silicon oxide, silicon nitride, polyimide, Dow SiLK™, Dow Cyclotene™, SiCOH or diamond-like films. In the example depicted in FIG. 3(*b*), large electron flux divergence creates a region 180 having several horizontally and vertically aligned slots 185 comprising insulating material through which conductor atoms cannot diffuse. The method depicted in FIG. 3(*b*) thus effectively breaks the long line segment into three pieces 150*d*, . . . , 150*f*, each segment being of a limited shorter length L2. A detailed description of the embodiments depicted in FIGS. 3(*b*) and 3(*c*) for breaking up the longer line segment to create short line segments may be found in commonly-owned, co-pending U.S. patent application Ser. No. 08/910,381, entitled PROCESS FOR PRODUCING METAL INTERCONNECTIONS AND PRODUCTS PRODUCED THEREBY, the contents and disclosure of which is wholly incorporated by reference as if fully set forth herein.

Described below are three exemplary processes as described in commonly-owned, co-pending U.S. patent application Ser. No. 08/910,381, which may be implemented to produce the metallization interconnections of the present invention. It is understood that these methods are only exemplary and are not limiting with respect to the techniques which may be used to practice the present invention.

PROCESS 1

Damascene Inter Level Contact with Subtractive Etch of Conductor

A. MULTI-LEVEL INTERCONNECTION SCHEME

Figure 4:
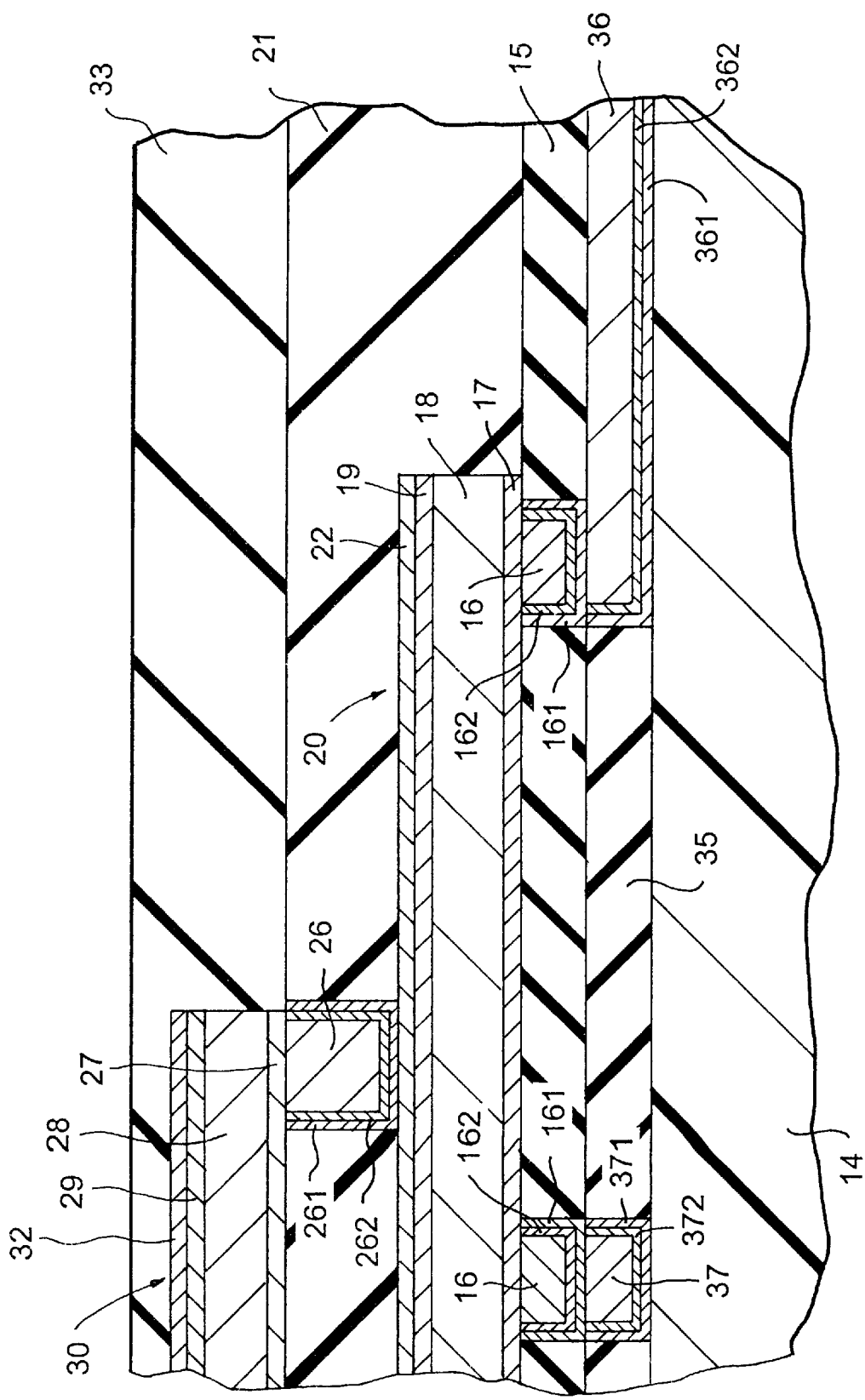
FIGS. 4 and 5 depict multi-level interconnection schemes that may be employed for fabricating electromigration resistant power distribution networks according to the invention.

As described herein, the power grid structure shown in FIG. 2(*d*) may be fabricated using both damascene and subtractive etch processes. FIG. 4 illustrates an integrated circuit device on a substrate 14 having multi-level interconnection schemes as described herein. As shown in FIG. 4 is a multi-level interconnection scheme formed by alternating stacked multiple metallization layers between SiO$_2$ insulating passivation layers 21, 33 and stacked SiO$_2$ insulating passivation layers 15 and 35. The stacked metallization layers were subtractively etched to form M1 and M2 conducting interconnects 20 and 30, respectively. Briefly, the damascene/subtractive etch process entails forming a damascene tungsten layer which fills a trench and a hole located in SiO$_2$ insulating passivation layer 35 to respectively form local conducting interconnect 36 and an interlevel connection stud 37 upon a substrate 14. A second SiO$_2$ insulating passivation layer 15 is disposed on both insulating passivation layer 35 and local conducting interconnect 36. Tungsten interlevel connection studs 16 are then formed in holes located in insulating passivation layer 15 using a damascene process. Multiple metallization layers are then laid down and a subtractive etch step is then performed to leave an M1 conducting interconnect 20 only in regions where it is desired. A planarized SiO$_2$ insulating passivation layer 21 is disposed on M1 conducting interconnect 20. The process is then repeated to form a second, M2 conducting interconnect 30 disposed upon insulating passivation layer 21 which is connected to M1 conducting interconnect 20 via a damascene tungsten interlevel connection stud 26. Both the multiple metallization layers of M1 conducting interconnect 20 and M2 conducting interconnect 30 comprise an aluminum-containing layer containing 0.5 wt %-Cu. A third SiO$_2$ insulating passivation layer 33 is disposed on both insulating passivation layer 21 and M2 conducting interconnect 30.

The subtractive etch/damascene process steps which may be used to make the integrated circuit device shown in FIG.

4 are known in the art of semiconductor manufacturing. An exemplary process which may be used is described in detail below with respect to the manufacture of the device shown in FIG. 4 and comprises the steps of:

a. depositing on a substrate 14 a $SiO_2$ insulating passivation layer 35 and planarizing using chemical mechanical polishing or an etch back technique which techniques are known in the art;

b. applying a resist layer and patterning level using lithographic techniques to locate holes where interlevel connection stud 37 and local conducting interconnect 36 are to be formed for establishing contact to the underlying substrate 14;

c. etching holes using the patterned resist layer as a mask;

d. depositing a barrier metallurgy such as 600 Å thick layer of titanium 361, 371 followed by a 400 Å thick layer of titanium nitride 362, 372;

e. depositing a 4000 Å–8000 Å layer of tungsten using chemical vapor deposition (CVD) to form interlevel connection stud 37 and local conducting interconnect 36;

f. removing excess tungsten metal and planarizing by chemical mechanical polishing using an etch or polish compound which selectively removes tungsten metal faster than the $SiO_2$ insulator material of $SiO_2$ insulating passivation layer 35;

g. depositing 6000 Å of $SiO_2$ insulator material to form an $SiO_2$ insulating passivation layer 15;

h. applying a resist and patterning using lithographic techniques to locate holes where interlevel connection studs 16 are to be formed in order to contact underlying tungsten local conducting interconnect 36 and interlevel connection stud 37;

i. etching holes using the patterned resist layer as a mask;

j. depositing a barrier metallurgy such as a 600 Å thick layer of titanium 161 followed by a 400 Å thick layer of titanium nitride 162;

k. depositing a 4000 Å–8000 Å layer of tungsten using chemical vapor deposition (CVD) to form interlevel connection studs 16;

l. removing excess tungsten metal and planarizing by chemical mechanical polishing using an etch or polish compound which selectively removes tungsten metal faster than the $SiO_2$ insulator material of $SiO_2$ insulating passivation layer 15;

m. depositing a layer of titanium by sputtering 150 Å titanium. Upon annealing in step r below, the titanium layer reacts with part of the aluminum-containing layer which is deposited in step n to form a $TiAl_3$ layer 17 of the multi-layer M1 conducting interconnect 20;

n. depositing an aluminum-containing layer by sputtering a 5400 Å thick layer of aluminum containing 0.5 wt % Cu. This aluminum-containing layer forms a middle aluminum-containing layer 18 of multi-layer M1 conducting interconnect 20;

o. sputtering a 150 Å layer of titanium followed by a 320 Å layer of titanium nitride. Upon annealing in step r below, the titanium layer reacts with part of the aluminum-containing layer deposited in step n to form a $TiAl_3$ layer 19 of the multi-layer M1 conducting interconnect 20. The titanium nitride layer forms titanium nitride layer 22 of M1 conducting interconnect 20;

p. applying a resist layer and, using lithographic techniques known in the art, patterning to locate an M1 conducting interconnect 20;

q. etching the multi-layer metal film using a chlorine-containing etch to form M1 conducting interconnect 20 having an aspect ratio as described in above-referenced commonly-owned, co-pending U.S. patent application Ser. No. 08/910,381;

r. annealing at 400° C. in 10% $H_2$/90% $N_2$ for a time sufficient to form the intermetallic compound $TiAl_3$ layers 17 and 19 and to dissolve any interfacial layers;

s. depositing a 18000 Å thick $SiO_2$ insulating passivation layer 21 and planarizing this layer using chemical mechanical polishing techniques which are known in the art;

t. applying a resist and patterning using lithographic techniques to locate holes where interlevel connection stud 26 is to be formed in order to contact underlying M1 conducting interconnect 20;

u. etching holes using the patterned resist layer as a mask;

v. depositing a barrier metallurgy such as a 600 Å thick layer of titanium 261 followed by a 400 Å thick layer of titanium nitride 262;

w. depositing a 4000 Å–8000 Å layer of tungsten using chemical vapor deposition (CVD) to form interlevel connection stud 26;

x. removing excess tungsten metal and planarizing by chemical mechanical polishing using an etch or polish compound which selectively removes tungsten metal faster than the $SiO_2$ insulator material of $SiO_2$ insulating passivation layer 21;

y. depositing a bottom layer of the multi-layer M2 conducting interconnect 30 by sputtering a 250 Å titanium. This bottom layer of titanium will form a $TiAl_3$ intermetallic layer 27 by reacting with part of an aluminum-containing layer which is deposited in step z during the annealing performed in step ad below;

z. depositing an aluminum-containing layer by sputtering a 7600 Å thick layer of aluminum containing 0.5 wt % Cu. This layer forms a middle, aluminum-containing layer 28 of multi-layer M2 conducting interconnect 30;

aa. sputtering a 130 Å thick layer of titanium followed by 250 Å thick layer of titanium nitride 32. The 250 Å titanium layer will form a $TiAl_3$ intermetallic layer 29 by reacting with part of the aluminum-containing layer deposited in previous step z during the annealing performed in step ad below;

ab. applying a resist, pattern as taught in commonly-owned, co-pending U.S. patent application Ser. No. 08/910,381 using lithographic techniques known in the art;

ac. etching the multi-layer metal film using a chlorine containing etch;

ad. annealing at 400° C. in 10% $H_2$/90% $N_2$ to form the intermetallic compound $TiAl_3$ layers 27 and 29 and to dissolve any interfacial layers; and ae. depositing a 18000 Å thick $SiO_2$ insulating passivation layer 33 and planarizing this layer using chemical mechanical polishing techniques known in the art.

Steps s through ae may be repeated to form additional layers of conducting interconnects.

B. ADDITIONAL MULTI-LEVEL INTERCONNECTION SCHEMES

Figure 5:
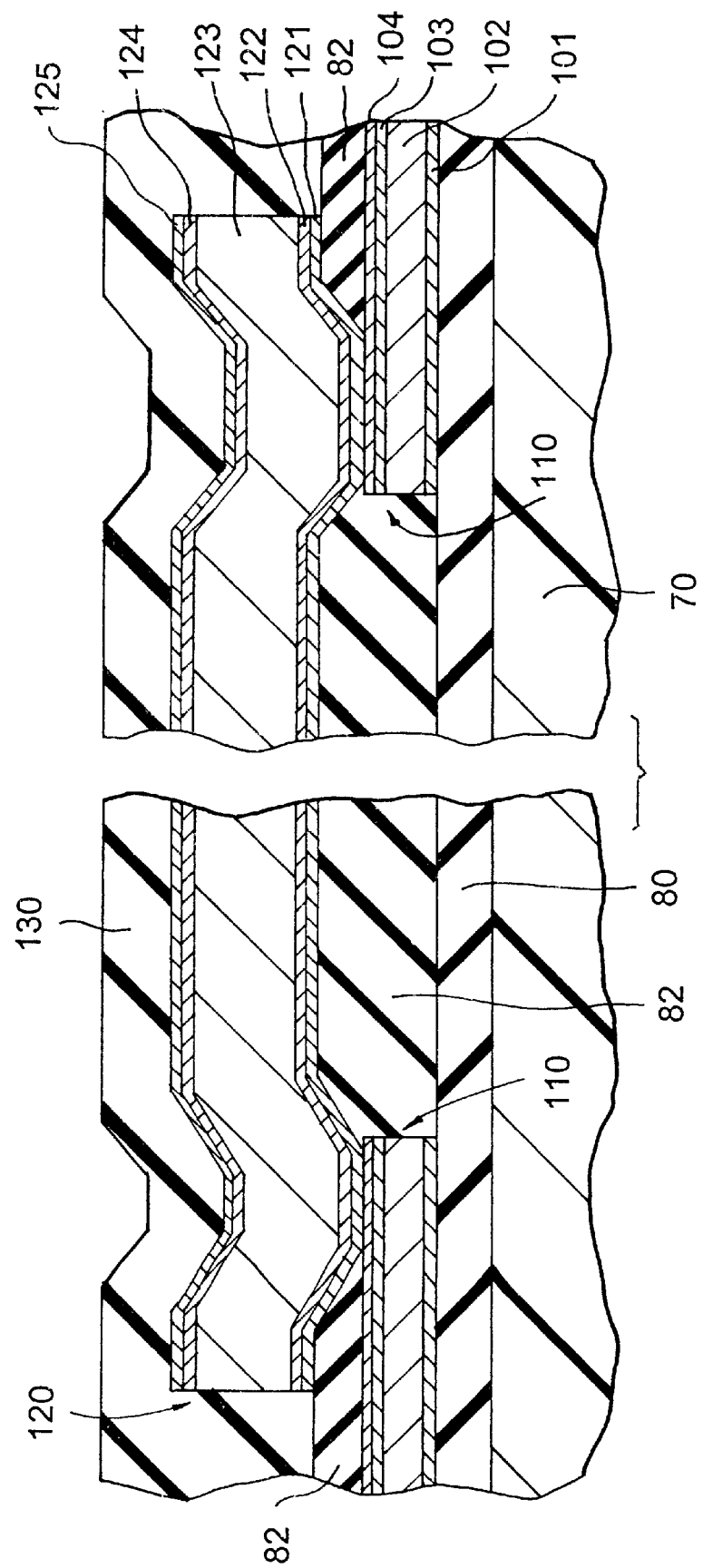

Additional multi-level interconnection schemes according to the present invention may also be fabricated using a subtractive etch process. Shown in FIG. 5 is a first level M1 conducting interconnect 110 having a titanium adhesive layer 101, an aluminum-containing layer 102, a second titanium layer 103, and an anti-reflection layer 104. M1 conducting interconnect 110 is formed on a substrate 70, which contains solid state devices (not shown), and insulating passivation layer 80. An insulating passivation layer 82 is also disposed above M1 conducting interconnect 110.

A second level M2 conducting interconnect 120 is disposed on insulating passivation layer 82 and is connected to M1 conducting interconnect 110. M2 conducting interconnect 120 has an adhesion layer 121 preferably of titanium, a diffusion barrier layer 122 preferably of titanium nitride, an aluminum-containing layer 123, a redundant metal layer 124 preferably of titanium, and an anti-reflection layer 125 preferably of titanium nitride. The solid state devices (not shown) of substrate 70 are indirectly connected to M2 conducting interconnect 120 via M1 conducting interconnect 110 as well as by contacts and conductors (not shown) which may be formed in the insulating passivation layer 80. An additional insulating passivation layer 130 is disposed on M2 conducting interconnect 120.

The multi-level interconnection schemes shown in FIG. 5 may be made using the following process:

a. forming on an insulating passivation layer 80 disposed on a substrate 70, M1 conducting interconnects 110 using steps s through y as described in the process set forth above;

b. depositing an insulating passivation layer 82 on M1 conducting interconnects 110 and insulating passivation layer 80;

c. applying a resist layer and pattern using lithographic techniques to locate holes where contact is to be established with underlying M1 conducting interconnects 110;

d. etching the underlying insulating passivation layer 82 using the resist layer as a mask;

e. etching the underlying insulating passivation layer 82 using a sputtered etch for providing a tapered via in M2 conducting interconnect 120 which is formed above M1 conducting interconnect 110 in steps f–k below;

f. depositing a layer of a conductive material, preferably titanium, for forming adhesion layer 121 of conducting interconnect 120;

g. depositing a second layer of titanium nitride which forms diffusion barrier layer 122;

h. depositing an aluminum-containing layer 123 comprising 0.5 wt % Cu;

i. depositing a layer which forms a refractory redundant layer 124 of conducting interconnect 120, preferably of a refractory metal such as titanium;

j. depositing a top layer of titanium nitride to serve as an anti-reflection layer 125;

k. applying a resist layer to the top of the multi-layer film formed in steps f–j and, using lithographic techniques known in the art, pattern to locate an M2 conducting interconnect 120 having aspect ratios in accordance with the present invention as set forth above;

l. transferring the pattern to the underlying conducting films by etching with a plasma containing C—Cl$_4$ to form M2 conducting interconnect 120;

m. depositing an overlying insulating passivation layer 130; and n. repeating steps a through m to produce additional interconnect levels as desired.

PROCESS 2

Damascene Inter Level Contact with Damascene Conductor

Alternative processes for producing interconnection schemes according to the present invention may also be used and may include damascene processes for forming both the metallization interconnects and interlevel connection studs by:

a. Depositing an insulating layer and planarize using chemical mechanical polishing or an etch back technique;

b. applying a first resist, and pattern the resist as taught in this invention using lithographic techniques known in the art;

c. transferring the pattern in the resist to the underlying insulator by etching troughs with depth equal to the desired thickness of the conducting interconnect to be produced;

d. removing the first resist layer;

e. applying a second resist layer and pattern using lithographic techniques to open holes where contacts to the underlying substrate are to be formed;

f. depositing the first layer of adhesion and barrier metallurgy;

g. depositing the second layer of conducting interconnect such as aluminum containing 0.5 wt % Cu, gold, or copper;

h. planarizing using chemical mechanical polishing to remove the excess metal outside the trough;

i. depositing an overlying insulating passivation layer; and j. repeating steps b through j as often as necessary.

PROCESS 3

Lift-Off Process

Interconnections in accordance with the present invention may also be fabricated by other known techniques such as by depositing a conductor material, lifting off the portion of unwanted conductor material to produce interconnects having aspect ratios as described above, followed by insulator deposition and planarization as are known in the art.

While the invention has been particularly shown and described with respect to illustrative and preformed embodiments thereof, it will be understood by those skilled in the art that the foregoing and other changes in form and detail may be made therein without departing from the spirit and scope of the invention which should be limited only by the scope of the appended claims.

Having thus described our invention, what we claim as new, and desire to secure the Letters Patent is:

1. A conductive grid structure for distributing electrical power with reduced electromigration in an integrated circuit device, said grid structure comprising:

a first layer including one or more sets of conducting line segments that are substantially parallel to one another and run in a first direction, each line segment of said one or more sets being of a finite length determined by a diffusion blocking boundary;

a layer of diffusion blocking dielectric insulation above the first layer;

a second layer including one or more sets of conducting line segments substantially parallel to each other and running in a second direction orthogonal to said first direction, each line segment of said one or more sets being of a finite length determined by a diffusion blocking boundary; and, interlevel contact means disposed substantially vertically through said diffusion blocking dielectric insulation layer for electrically connecting aligned line like segments of respective sets of said one or more sets of line segments of said first and second layers, wherein adjacent finite length segments of each said one or more sets of line segments of each layer are systematically phase shifted and located to enable continuous projection of said grid throughout said integrated circuit device.

2. The grid structure as claimed in claim 1, wherein one or more conducting line segments of said one or more sets of conducting line segments are substantially linearly aligned and separated by a gap, said systematic phase shift comprising shifting each gap by a fraction of the length of an individual conducting line segment with respect to an adjacent substantially parallel conducting line segment.

3. The grid structure as claimed in claim 1, wherein a predetermined length of conducting line segments in said first and second layers is less than or equal to about 300 micrometers.

4. The grid structure as claimed in claim 1, wherein said line segments comprise a metallic element selected from the group consisting of gold, copper, aluminum, silver or, alloys thereof.

5. The grid structure as claimed in claim 1, wherein conducting line segments of a first set of said one or more sets function to carry power supply voltage for powering said integrated circuit chip, and conducting line segments of a second set of said one or more sets function to provide a ground potential, said interlevel contact means connecting like conducting line segments.

6. The grid structure as claimed in claim 5, wherein said interlevel contact means is a stud comprising an element selected from the group consisting of W, Ta, Re, Hf, TiN, Pt, Ir, Zr, Ti or, alloys thereof.

7. The grid structure as claimed in claim 5, wherein each said conducting line segments are surrounded by diffusion blocking material comprising an insulating dielectric, said insulating dielectric selected from the group consisting of silicon oxide, silicon nitride, polyimide, Dow SiLK™, Dow Cyclotene™, SiCOH or diamond-like films.

8. The grid structure as claimed in claim 5, wherein said insulating layer is a dielectric material selected from the group consisting of silicon oxide, silicon nitride, polyimide, Dow SiLK™, Dow Cyclotene™, SiCOH or diamond-like films.

9. The grid structure as claimed in claim 5, wherein said interlevel contact means comprises a conducting oxide, nitride or carbide material.

10. The grid structure as claimed in claim 5, further including one or more additional layers including additional sets of conducting line segments substantially parallel to each other and running in a direction orthogonal to a direction of line segments in an immediate prior layer, and further including interlevel contact means disposed through said insulating layer for connecting like line segments of adjacent layers.

11. The grid structure as claimed in claim 10, wherein said interlevel contact diffusion blocking material creates a blocking boundary, a blocking boundary implemented by converting conducting line segment into a plurality of narrow interconnects separated by each other by insulating dielectric material and resulting in creation of a strong electron current flux divergence to result in a short line segment.

12. The grid structure as claimed in claim 5, wherein said conducting line segments of said one or more sets are subdivided into subsections, each said subsection comprising conducting line segments of different metals.

13. The grid structure as claimed in claim 1, wherein said interlevel contact means is fabricated wholly or in part with a diffusion blocking material.

14. The grid structure as claimed in claim 1, including one set of conductors operating at a single potential.

15. The grid structure as claimed in claim 1, wherein first and second sets of conductors of each said first and second layers operate at different potential.

16. The grid structure as claimed in claim 1, wherein said grid comprises a multilevel structure having two or more layers of conducting line segments, each layer having one or more sets of conducting line segments operating at same or different potentials.

17. The grid structure as claimed in claim 1, wherein said line segment is fabricated wholly or in part with a diffusion blocking material.

18. The grid structure as claimed in claim 1, wherein said line segment comprises an element selected from the group consisting of W, Ta, Re, Hf, TiN, Pt, Ir, Zr, Ti or, alloys thereof.

19. A method for manufacturing a conductive grid structure for distributing electrical power with increased electromigration resistance in an integrated circuit device, said method comprising:

a) fabricating a first metal layer comprising one or more sets of conducting line segments that are substantially parallel to one another and run in a first direction, each conducting line segment of said one or more sets of line segments being of a finite length determined by a diffusion blocking boundary;

b) fabricating a layer of diffusion blocking dielectric insulation above the first metal layer;

c) fabricating interlevel contact means disposed substantially vertically through said diffusion blocking dielectric insulation layer for electrically connecting line segments of said first layer at locations to be in alignment with like conducting line segments of respective one or more sets provided in a second layer of said grid structure; and, d) fabricating a second metal layer including said one or more sets of conducting line segments substantially parallel to each other and running in a second direction orthogonal to said first direction, each conducting line segment of said one or more sets of line segments being of a finite length determined by a diffusion blocking boundary, wherein adjacent finite length segments of each said one or more sets of line segments of each said layer are systematically phase shifted and located to enable continuous projection of said grid throughout said integrated circuit device.

20. The method according to claim 19, wherein said fabricating steps a) through d) includes utilizing subtractive etch technique to pattern said first and second metal layers, said diffusion blocking interlevel dielectric and said interlevel contact means.

21. The method according to claim 19, wherein said interlevel contacts are fabricated wholly or in part with a diffusion block substance.

22. The method according to claim 21, further utilizing single or dual damascene patterned diffusion blocking dielectric to transfer a pattern to a metal layer.

23. The method according to claim 19, wherein one or more conducting line segments of said one or more sets of conducting line segments are substantially linearly aligned and separated by a gap, said systematic phase shift comprising shifting each gap by a fraction of the length of an individual conducting line segment with respect to an adjacent substantially parallel conducting line segment.

24. The method according to claim 23, wherein prior to said fabricating steps a), b), c) and d), the steps of:
   a) defining an origin at a lower left corner of a semiconductor chip or area to receive said grid structure, whereby locations in said grid structure are defined as (x,y) coordinates with x representing a horizontal coordinate and y representing a vertical coordinate;
   b) choosing dimensions $x_0, y_0$ for governing periodicity of power supply conducting line segments forming said grid structure;
   c) choosing dimensions $x_1, y_1$ for determining a gap between grids;
   d) for said step a), on said first metal layer, designating for placement a first conducting line segment of a first power bus from a location $(0, 0+y_1)$ to $(0, By_0-y_1)$ and subsequent first power bus conducting line segments from $\{ix_0, (Bj+i)y_0+y_1\}$ to $\{ix_0, (Bj+i+B)y_0-y_1)\}$ where i and j both indicate a degree of phase shift or offset between adjacent segments with $i=0,1,2,3, \ldots, ns_{1i}$; $j=-i-1, -i, -i+1, -i+2, \ldots 0,1,2,3, \ldots, ns_{1j}$ with $ns_{1i}$ and $ns_{1j}$ being limits of the indices for positioning segments on said first metal layer, and B is an integer $>=1$; and
   e) wherein on said first metal layer, designating for placement second conducting line segments of a second power bus from $\{(i+1/2)x_0, (Bj+i+1/2)y_0+y_1\}$ to $\{(i+1/2)x_0, (Bj+i+B+1/2)y_0-y_1)\}$ where i and j both indicate a degree of phase shift or offset between adjacent segments with $i=0,1,2,3,4 \ldots, nd_{1i}$; $j=-i-i, -1, -i+1, -i+2, \ldots 0,1,2,3,4, \ldots, nd_{1j}$ where $nd_{1i}$ and $nd_{1j}$ are limits of the indices for positioning second segments on the first metal layer and B is an integer $>=1$;
   f) wherein fabricating step c) comprises locating on the diffusion blocking dielectric insulation layer, designating for placement said interlevel contact means for contacting first power bus conducting line segments at locations $\{kx_0, (l+1/2)y_0\}$ where $k=0,1,2,3,4, \ldots, ns_k$, and $l=0,1,2,3,4, \ldots ns_l$, where $ns_k$ and $ns_l$ are limits of the indices for positioning interlevel vias connecting like segments at first and second metal levels, and fabricating said interlevel contact means for contacting second power bus conducting line segments at locations $\{(k+1/2)x_0, ly_0\}$ where $k=0,1,2,3,4, \ldots, nd_k$ and $l=0,1,2,3,4, \ldots, nd_l$ where $nd_k$ and $nd_l$ are limits of indices for positioning interlevel vias connecting like segments at first and second metal levels;
   g) on said second metal layer, designating for placement a first conducting line segment of a first power bus from a location $\{-3/2x_0+x_1, y_0/2\}$ to $\{(-3/2+A)x_0-x_1, y_0/2\}$ and placing subsequent first power bus conducting line segments from $\{(-3/2)x_0+(Ai+j)x_0+x_1, (j+1)y_0-y_s\}$ to $\{(-3/2)x_0+(Ai+j+A)x_0-x_1, (j+1)y_0-y_s\}$ where $y_s$ is a shift constant, and where i and j both indicate a degree of phase shift or offset between adjacent segments with $j=0,1,2,3 \ldots, ms_{2j}$; $i=-j-1, -j, -j+1, -j+2, \ldots 0,1,2,3, \ldots, ms_{2i}$ where $ms_{2j}$ and $ms_{2i}$ are limits of indices for positioning first segments on the second metal level, and A is an integer $>=1$; and,
   h) on said second metal layer, designating for placement second conducting line segments of a second power bus from $\{-x_0+(Ai+j)x_0+x_1, (j+1)y_0-y_d+y_0/2\}$ to $\{-x_0+(Ai+j+A)x_0-x_1, (j+1)y_0-y_d+y_0/2\}$, where $y_d$ is a shift constant, and where i and j both indicate a degree of phase shift or offset between adjacent segments with $j=0,1,2,3,4, \ldots, md_{2j}$; $i=-j-1, -j, -j+1, -j+2, \ldots, 0,1,2, \ldots, md_{2i}$, where $md_{2j}$ and $md_{2i}$ are limits of indices for positioning second segments on the second metal level, A is an integer $>=1$.

25. The method according to claim 24, wherein said grid coordinate $x_0/2$ and $y_0/2$ and multiples thereof govern space between the power supply conducting line segments between which active circuitry of a semiconductor chip is placed.

26. The method according to claim 24, wherein a length of said conducting line segments of said one or more sets is governed according to $Ax_0-2x_1$ in a horizontal dimension, and $By_0-2y_1$ in a vertical dimension, wherein A is equal to B and A,B $>=1$, wherein A and B values determine the redundancy of said grid.

27. The method according to claim 24, further including the step of deleting conducting line segment portions lying outside a predefined chip boundary.

28. The method as claimed in claim 24, further including steps of generating line segments of length $x_0^1, x_0^2, x_0^3, \ldots, x_0^i$ and gaps $x_1^1, x_1^2, x_1^3, \ldots, x_1^i$, and segment lengths $Ax_0^1-2x_1^1, Ax_0^2-2x_1^2, Ax_0^3-2x_1^3$ in order to supply multiple sources and sinks of electrons at different potentials, where 1, 2, 3, . . . ,i represents a different source/sink.

29. A program storage device readable by a machine, tangibly embodying a program of instructions executable by the machine to perform method steps for generating a power distribution network for an integrated circuit, said method steps comprising:
   (a) receiving integrated circuit input parameters for determining a length of a conductive segment of said network;
   (b) iteratively generating one or more sets of unconnected segments on a first level of a multilevel structure, each said unconnected segment of said determined length, said one or more sets of segments lying in a horizontal dimension and spaced from each other according to a periodicity and phase shift determined by received circuit design input parameters;
   (c) iteratively generating one or more sets of unconnected segments on a second level of said multilevel structure, each said unconnected segment of said second level lying horizontal and orthogonal to said segments on said first level, said one or more sets of segments spaced from each other according to a periodicity and phase shift determined by the received circuit design input parameters; and,
   (d) attaching each segment of said one or more sets of segments in the first level by two or more vertical interlevel contacts to like segments of respective said one or more sets of segments in a second level of the multilevel structure to form said network, wherein the generated power distribution network exhibits superior electromigration resistance and wireability of signals.

30. The program storage device readable by a machine according to claim 29, further including the step of generating additional sets of data representing additional interconnection levels.

31. The program storage device readable by a machine according to claim 29, further including the step of generating chip physical design data representing required horizontal dimensions.

32. The program storage device readable by a machine according to claim 29, wherein said circuit design input parameters includes one or more selected from the group comprising: cell pitch and size, chip size, core and chip boundaries, minimum and maximum physical dimension of a gap determining said periodicity, a number of power supplies, a number of wiring levels, a Vdd level, a wire width, a core or macro location, and I/O placement.

33. The program storage device readable by a machine according to claim 32, wherein said method further includes the step of removing segments which lie beyond a chip dimension specified by said input parameters.

34. The program storage device readable by a machine according to claim 32, wherein said circuit design input parameters further includes input parameters for redundancy requirements selected from the group comprising: electromigration design rules, IR drop limit, and, power consumption of the chip.

35. The program storage device readable by a machine according to claim 29, wherein step (b) comprises the steps of:

choosing dimensions $x_0, y_0$ for governing periodicity of power supply conducting line segments forming said grid structure;

choosing dimensions $x_1, y_1$ for determining a gap between grids;

on said first metal layer, designating for placement a first conducting line segment of a first power bus from a location $(0, 0+y_1)$ to $(0, By_0-y_1)$ and subsequent first power bus conducting line segments from $\{ix_0, (Bj+i)y_0+y_1\}$ to $\{ix_0, (Bj+i+B)y_0-y_1)\}$ where i and j both indicate a degree of phase shift or offset between adjacent segments with $i=0,1,2,3,\ldots,ns_{1i}$; $j=-i-1, -i, -i+1, -i+2, \ldots 0,1,2,3,\ldots,ns_{1j}$ with $ns_{1i}$ and $ns_{1j}$ being limits of the indices for positioning segments on said first metal layer, and B is an integer $>=1$; and wherein on said first metal layer, designating for placement second conducting line segments of a second power bus from $\{(i+1/2)x_0, (Bj+i+1/2)y_0+y_1\}$ to $\{(i+1/2)x_0, (Bj+i+B+1/2)y_0-y_1)\}$ where i and j both indicate a degree of phase shift or offset between adjacent segments with $i=0,1,2,3,4\ldots,nd_{1i}$; $j=-i-1, -i, -i+1, -i+2, \ldots 0,1,2,3,4,\ldots,nd_{1j}$ where $nd_{1i}$ and $nd_{1j}$ are limits of the indices for positioning second segments on the first metal layer and B is an integer $>=1$.

36. The program storage device readable by a machine according to claim 29, wherein step (c) comprises the steps of:

on said second metal layer, designating for placement a first conducting line segment of a first power bus from a location $\{-3/2x_0+x_1, y_0/2\}$ to $\{(-3/2+A)x_0-x_1, y_0/2\}$ and placing subsequent first power bus conducting line segments from $\{(-3/2)x_0+(Ai+j)x_0+x_1, (j+1)y_0-y_s\}$ to $\{(-3/2)x_0+(Ai+j+A)x_0-x_1, (j+1)y_0-y_s\}$ where $y_s$ is a shift constant and where i and j both indicate a degree of phase shift or offset between adjacent segments with $j=0,1,2,3\ldots,ms_{2j}$; $i=-j-1, -j, -j+1, -j+2 \ldots 0,1,2,3,\ldots,ms_{2i}$ where $ms_{2j}$ and $ms_{2i}$ are limits of indices for positioning first segments on the second metal level, and A is an integer $>=1$; and, on said second metal layer, designating for placement second conducting line segments of a second power bus from $\{-x_0+(Ai+j)x_0+x_1, (j+1)y_0-y_d+y_0/2\}$ to $\{-x_0+(Ai+j+A)x_0-x_1, (j+1)y_0-y_d+y_0/2\}$, where $y_d$ is a shift constant, and where i and j both indicate a degree of phase shift or offset between adjacent segments with $j=0,1,2,3,4,\ldots, md_{2j}$; $i=-j-1, -j, -j+1, -j+2, \ldots, 0,1,2,\ldots,md_{2i}$, where $md_{2j}$ and $md_{2i}$ are limits of indices for positioning second segments on the second metal level, A is an integer $>=1$.

37. The program storage device readable by a machine according to claim 29, wherein step (d) comprises the step of:

designating for placement interlevel contact means for contacting first power bus conducting line segments at locations $\{kx_0, (l+1/2)y_0\}$ where $k=0,1,2,3,4,\ldots,ns_k$, and $l=0,1,2,3,4,\ldots ns_l$ where $ns_k$ and $ns_l$ are limits of the indices for positioning interlevel vias connecting like segments at first and second metal levels, and fabricating said interlevel contact means for contacting second power bus conducting line segments at locations $\{(k+1/2)x_0, ly_0\}$ where $k=0,1,2,3,4,\ldots,nd_k$ and $l=0,1,2,3,4,\ldots,nd_l$ where $nd_k$ and $nd_l$ are limits of indices for positioning interlevel vias connecting like segments at first and second metal levels.

38. A method for generating a power distribution network for an integrated circuit comprising:

(a) receiving integrated circuit input parameters for determining a length of a conductive segment of said network;

(b) iteratively generating one or more sets of unconnected segments on a first level of a multilevel structure, each said unconnected segment of said determined length, said one or more sets of segments lying in a horizontal dimension and spaced from each other according to a periodicity and phase shift determined by received circuit design input parameters;

(c) iteratively generating one or more sets of unconnected segments on a second level of said multilevel structure, each said unconnected segment of said second level lying horizontal and orthogonal to said segments on said first level, said one or more sets of segments spaced from each other according to a periodicity and phase shift determined by the received circuit design input parameters; and, (d) attaching each segment of said one or more sets of segments in the first level by two or more vertical interlevel contacts to like segments of respective said one or more sets of segments in a second level of the multilevel structure to form said network, wherein the generated power distribution network exhibits superior electromigration resistance and wireability of signals.

39. The method according to claim 38, further including the step of generating additional sets of data representing additional interconnection levels.

40. The method according to claim 38, further including the step of generating chip physical design data representing required horizontal dimensions.

41. The method according to claim 38, wherein said circuit design input parameters includes one or more selected from the group comprising: cell pitch and size, chip size, core and chip boundaries, minimum and maximum physical dimension of a gap determining said periodicity, a number of power supplies, a number of wiring levels, a Vdd level, a wire width, a core or macro location, and I/O placement.

42. The method according to claim 41, wherein said method further includes the step of removing segments which lie beyond a chip dimension specified by said input parameters.

43. The method according to claim 41, wherein said circuit design input parameters further includes input parameters for redundancy requirements selected from the group comprising:

electromigration design rules, IR drop limit, and, power consumption of the chip.

44. The method according to claim 38, wherein step (b) comprises the steps of:

choosing dimensions $x_0, y_0$ for governing periodicity of power supply conducting line segments forming said grid structure;

choosing dimensions $x_1, y_1$ for determining a gap between grids;

on said first metal layer, designating for placement a first conducting line segment of a first power bus from a location $(0, 0+y_1)$ to $(0, By_0-y_1)$ and subsequent first power bus conducting line segments from $\{ix_0, (Bj+i)y_0+y_1\}$ to $\{ix_0, (Bj+i+B)y_0-y_1)\}$ where i and j both indicate a degree of phase shift or offset between adjacent segments with $i=0,1,2,3, \ldots, ns_{1i}$; $j=-i-1, -i, -i+1, -i+2, \ldots 0,1,2,3, \ldots, ns_{1j}$ with $ns_{1i}$ and $ns_{1j}$ being limits of the indices for positioning segments on said first metal layer, and B is an integer >=1; and wherein on said first metal layer, designating for placement second conducting line segments of a second power bus from $\{(i+1/2)x_0, (Bj+i+1/2)y_0+y_1\}$ to $\{(i+1/2)x_0, (Bj+i+B+1/2)y_0-y_1)\}$ where i and j both indicate a degree of phase shift or offset between adjacent segments with $i=0,1,2,3,4 \ldots, nd_{1i}$; $j=-i-1, -i, -i+1, -i+2, \ldots 0,1,2,3,4, \ldots, nd_{1j}$ where $nd_{1i}$ and $nd_{1j}$ are limits of the indices for positioning second segments on the first metal layer and B is an integer >=1.

45. The method according to claim 38, wherein step (c) comprises the steps of:

on said second metal layer, designating for placement a first conducting line segment of a first power bus from a location $\{-3/2x_0+x_1, y_0/2\}$ to $\{(-3/2+A)x_0-x_1, y_0/2\}$ and placing subsequent first power bus conducting line segments from $\{(-3/2)x_0+(Ai+j)x_0+x_1, (j+1)y_0-y_s\}$ to $\{(-3/2)x_0+(Ai+j+A)x_0-x_1, (j+1)y_0-y_s\}$ where $y_s$ is a shift constant and where i and j both indicate a degree of phase shift or offset between adjacent segments with $j=0,1,2,3 \ldots, ms_{2j}$; $i=-j-1, -j, -j+1, -j+2, \ldots 0,1,2,3, \ldots, ms_{2i}$ where $ms_{2j}$ and $ms_{2i}$ are limits of indices for positioning first segments on the second metal level, and A is an integer >=1; and, on said second metal layer, designating for placement second conducting line segments of a second power bus from $\{-x_0+(Ai+j)x_0+x_1, (j+1)y_0-y_d+y_0/2\}$ to $\{-x_0+(Ai+j+A)x_0-x_1, (j+1)y_0-y_d+y_0/2\}$, where $y_d$ is a shift constant, and where i and j both indicate a degree of phase shift or offset between adjacent segments with $j=0,1,2,3,4, \ldots, md_{2j}$; $i=-j-1, -j, -j+1, -j+2, \ldots, 0,1,2, \ldots, md_{2i}$, where $md_{2j}$ and $md_{2i}$ are limits of indices for positioning second segments on the second metal level, A is an integer >=1.

46. The program storage device readable by a machine according to claim 38, wherein step (d) comprises the step of:

designating for placement interlevel contact means for contacting first power bus conducting line segments at locations $\{kx_0, (l+1/2)y_0\}$ where $k=0,1,2,3,4, \ldots, ns_k$, and $l=0,1,2,3,4, \ldots ns_l$ where $ns_k$ and $ns_l$ are limits of the indices for positioning interlevel vias connecting like segments at first and second metal levels, and fabricating said interlevel contact means for contacting second power bus conducting line segments at locations $\{(k+1/2)x_0, ly_0\}$ where $k=0,1,2,3,4, \ldots, nd_k$ and $l=0,1,2,3,4, \ldots, nd_l$ where $nd_k$ and $nd_l$ are limits of indices for positioning interlevel vias connecting like segments at first and second metal levels.

* * * * *

UNITED STATES PATENT AND TRADEMARK OFFICE
CERTIFICATE OF CORRECTION

PATENT NO. : 6,202,191 B1
DATED : March 13, 2001
INVENTOR(S) : R.G. Filippi et al.

Page 1 of 1

It is certified that error appears in the above-identified patent and that said Letters Patent is hereby corrected as shown below:

Column 7, claim 36,
Line 51, "-j+2..." should read -- j-2,... --

Column 15, claim 24,
Line 31, "j=-i-i,-1" should read -- j=-I-1,-I,-I+1 --

Signed and Sealed this

Fourth Day of December, 2001

*Attest:*

*Attesting Officer*

NICHOLAS P. GODICI
*Acting Director of the United States Patent and Trademark Office*